United States Patent [19]

Denisevich, Jr. et al.

[11] Patent Number: 4,502,980

[45] Date of Patent: Mar. 5, 1985

[54] DITHIENE ELECTROACTIVE POLYMERS

[75] Inventors: Peter Denisevich, Jr., El Cerrito; Shigeto Suzuki, San Francisco; Victor P. Kurkov, San Rafael; Albert H. Schroeder, Richmond, all of Calif.

[73] Assignee: Chevron Research Company, San Francisco, Calif.

[21] Appl. No.: 442,396

[22] Filed: Nov. 17, 1982

[51] Int. Cl.$^3$ .................... H01B 1/00; H01B 1/02; H01B 1/06
[52] U.S. Cl. .................... 252/500; 252/512; 252/518
[58] Field of Search ............ 528/183, 363, 341; 252/500, 512, 518

[56] References Cited

U.S. PATENT DOCUMENTS

| 4,026,905 | 5/1977 | Cohen et al. | 252/500 |
| 4,204,216 | 5/1980 | Heeger et al. | 252/500 |
| 4,375,427 | 3/1983 | Miller et al. | 252/500 |

FOREIGN PATENT DOCUMENTS 0037924 10/1981 European Pat. Off. .

*Primary Examiner*—Lester L. Lee
*Attorney, Agent, or Firm*—S. R. LaPaglia; T. G. DeJonghe; C. J. Caroli

[57] ABSTRACT

Tractable doped electroactive polymers, comprising recurring units of a 1,4-dithiene ring system, and a sufficient concentration of a charge-compensating ionic dopant associated therewith.

17 Claims, No Drawings

DITHIENE ELECTROACTIVE POLYMERS

BACKGROUND OF THE INVENTION

This invention relates to electroactive organic polymeric materials. More specifically, this invention relates to associating electroactivating agents known in the art as dopants with an organic polymer.

Recently, research has been conducted into organic polymeric materials in order to modify their room temperature electrical conductivity by reacting them with electron donor or acceptor molecules. The electron donor or acceptor molecules, generally known in the art as n- and p-type dopants respectively, can transform the organic polymeric materials so that these modified organic polymeric materials exhibit semiconducting and metallic room temperature electrical conductivity. Polyacetylene is an example of an organic polymeric material whose room temperature electrical conductivity can be modified over several orders of magnitude above its insulator state, by the incorporation of dopant molecules, A. J. Heeger et al, U.S. Pat. No. 4,222,903, said patent incorporated herein by reference. Other examples of organic polymeric materials whose room temperature electrical conductivity can be enhanced by several orders of magnitude over their insulator state by means of incorporation of dopant molecules are poly-p-phenylene, polypyrrole, poly-1,6 heptadiyne, and polyphenylene vinylene. However, all of the above recited examples are of organic polymeric materials which are completely insoluble or infusable and hence are completely intractable.

Other examples of organic polymers whose room temperature electrical conductivity can be modified with the aid of dopants are polyphenylene sulfide and poly-m-phenylene. However, the above recited materials though being tractable in their original virgin state, undergo irreversible chemistry when reacted with dopants which modify their room temperature electrical conductivity. This irreversible chemistry imparts upon these dopant modified organic polymeric materials a state of intractability. Upon removal of the doping agents, these materials do not revert to the chemical structure which they originally exhibited prior to being modified by the dopants. The inorganic material polysulfur nitride is also considered a polymeric conductor. As with the previously recited polymeric materials, polysulfur nitride is also completely intractable.

For use in a wide variety of electronic device applications, it is highly desirable to have available organic polymeric electrically conducting materials having a preselected room temperature conductivity which can be varied over a broad range. This range should preferably extend from the insulator state of the unmodified organic polymeric material through the semiconducting regime and extending into the highly conducting metallic state. It is also desirable that these organic polymeric electrically conducting materials should be tractable and hence processable so that useful articles of any desired shape and size can be fabricated. Tractable organic polymers are those which can be readily shaped, formed, molded, pressed, cast, etc., into desired articles from the liquid state, i.e. either from the melt, fluid glassy state, or from solution after the completion of the polymerization reaction of the organic polymeric material.

SUMMARY OF THE INVENTION

We have invented an electroactive polymeric material comprising a dopant modified organic polymer whose room temperature electrical conductivity is controlled in a highly selective and reversible manner. Electroactive polymer is defined as a polymer having a conductivity which has been modified with electron acceptor or donor dopants to be greater than the conductivity of the virgin state of the polymer. The electroactive organic polymeric material is fabricated from a virgin polymer, which in itself is completely tractable and processable and which exhibits excellent mechanical and thermal properties as well as being highly stable to oxidative degradation, by modifying the polymer with a conductivity modifier, i.e. electron donor dopants or electron acceptor dopants. The electroactive organic polymeric material is comprised of recurring units of a 1,4-dithiene ring system and a conductivity modifier. More specifically, the electroactive polymer is a charged polymer backbone incorporating a sufficient concentration of charge-compensating ionic dopants, i.e., ions of opposite charge to the charge of the polymer backbone. A sufficient concentration of ionic dopants is defined as that concentration which, when associated with the polymer, effects a significant increase in the polymer conductivity, i.e., on the order of about 10% or greater. The recurring units are diradicals. The diradicals are directly linked to one another, or may be connected to one another via connecting units. A "connecting unit" is defined as any atom or group of atoms which can link the hereinabove diradicals together into a polymer chain.

Among other factors, the present invention is based on our discovery that 1,4-dithiene polymers can be effectively doped with conductivity modifiers to provide electroactive polymers having an electrical conductivity several orders of magnitude greater than the conductivity of the undoped virgin polymers. In addition, the electroactive polymers of the invention are highly tractable and processable and therefore overcome the disadvantages of prior art materials.

An n-type electroactive organic polymer is obtained by reacting the virgin polymer with reducing or electron donor dopants. Electron donor dopants induce n-type conductivity in the polymer by donating an electron to the polymer and reducing same to a polyanion and the dopant is oxidized to a cation. Similarly, a p-type electroactive organic polymer is obtained by reacting the virgin polymer with oxidizing electron acceptor dopants. Electron acceptor dopants induce p-type conductivity in the polymer by oxidizing the polymer to a polycation and the dopant is reduced to an anion. The desired value of the room temperature electrical conductivity of the dopant modified electroactive organic polymer is preselected by controlling the level of incorporation of the dopants into the virgin polymer. Alternatively, the desired value of the room temperature electrical conductivity of the dopant modified electroactive organic polymer is preselected by controlling the length of the reaction time between the virgin polymer and dopants. Furthermore, the highly selective and reversible modification of the room temperature electrical conductivity of the virgin polymer can proceed by either chemical or electrochemical means. The highly selective and reversible modification of the electrical conductivity of the dopant containing organic polymeric material together with the tractability and processability of the virgin polymer is highly desirable in that the fabrication of useful articles and devices such as primary and secondary batteries, photovoltaic devices, Schottky type devices can be accomplished. Furthermore, the materials described in this invention can be utilized as active components in such devices and articles as electrochromic displays and photolithographic processes.

DETAILED DESCRIPTION OF THE INVENTION

Electroactive organic polymers are of tractable and processable virgin polymers consisting of recurring units of a 1,4-dithiene ring system modified by suitable conductivity modifiers. The polymers are composed of repeating diradical units derived from 1,4-dithiene ring systems. A diradical is defined as a molecule that has two unsatisfied positions available for linking into the polymer chain. Optionally, the diradicals are separated in the polymer chain by connecting units. The recurring units can be interspersed with one or more connecting units such as O, S, aryl, substituted aryl, alkenyl, thioalkenyl, thioaryl, and the like. Preferred connecting units are 1,4-phenylene, 4,4'-biphenylene, —CH═CH—, and —C≡C—. A particularly preferred connecting unit is 1,4-phenylene. The connecting units can be the same or different between adjacent recurring units in the polymer chain.

The polymer can be a homopolymer of the dithiene diradicals or a copolymer of the diradicals. A homopolymer is defined as a polymer comprising the same recurring diradical. A copolymer is defined as a polymer comprising different diradicals. In addition, the polymer is a copolymer if the same or different recurring diradicals are interspersed with connecting units.

The polymer is rendered electroactive by incorporating into the virgin polymer a conductivity modifier. More specifically, the polymer is rendered electroactive by adding electrons to (reducing) or removing electrons from (oxidizing) the virgin polymer backbone. This can be accomplished by incorporating into the virgin polymer a conductivity modifier which is either an electron donor dopant or an electron acceptor dopant. An electron donor dopant donates an electron to the polymer, the polymer becoming reduced to a polyanion and the dopant becoming oxidized to a cation. An electron acceptor dopant removes an electron from the polymer, the polymer becoming oxidized to a polycation and the dopant becoming reduced to an anion. Alternatively, the polymer can be rendered electroactive by electrochemical oxidation or reduction. In this case an electron is removed from or added to the polymer from an electrode, and charge-compensating anions or cations, respectively, are incorporated into the polymer from the supporting electrolyte solution.

In both cases the resulting electroactive polymer consists of a charged polymer backbone incorporating charge-compensating ionic dopants. A suitable positively charged compensating dopant can be a cation such as the alkali metal ions, alkali earth metal ions, Group III metal ions, strong Lewis acids, and organic cations such as

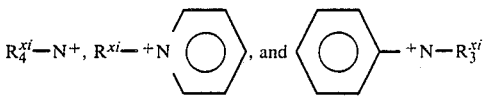

where $R^{xi}$ is a straight- or branched-chain alkyl group of $C_1$-$C_6$. Mixtures of these charge-compensating dopants can be employed. These ionic dopants produce n-type conductivity when associated with a reduced or negatively charged polymer polyanion.

A suitable negatively charged compensating dopant, i.e. anionic dopants, can be an anion such as the halogen ions, other ions such as $AsF_4^-$, and preferably ions such as $AsF_6^-$, $ClO_4^-$, $PF_6^-$, $SO_3CF_3^-$, $BF_4^-$, $NO_3^-$, $POF_4^-$, $CN^-$, $SiF_5^-$, $SbCl_6^-$, $SbF_6^-$, $HSO_4^-$, organic anions ions such as $CH_3CO_2^-$, (acetate), $C_6H_5CO_2^-$ (benzoate), $CH_3C_6H_4SO_3^-$ (tosylate), strong Lewis bases, and the like. Mixtures of the charge-compensating dopants can be employed. These ionic dopants produce a p-type conductivity when associated with an oxidized or positively charged polymer polycation.

The dopant modified electroactive polymer has a charge opposite to the conductivity modifier, i.e. ionic dopant. The charges on the dopant modified electroactive polymer and the ionic dopant balance so that the dopant modified electroactive polymer is an electrically neutral system. The association of the virgin polymer with electron donor dopants produces an electroactive polymer which exhibits n-type conductivity. More specifically, reduction of the virgin polymer and the incorporation of cationic charge-compensating dopants produces a polymer which exhibits n-type conductivity. The association of the virgin polymer with electron acceptor dopants produces an electroactive polymer with p-type conductivity. More specifically, oxidation of the polymer and incorporation of anionic charge-compensating dopants produces a polymer with p-type conductivity.

The preferred electroactive polymers of the invention have the following formula:

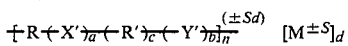

where a is either 0 or 1; b is either 0 or 1; c is either 0 or 1; n is an integer from 2 to 1,000; d is an integer from 1 to 2,000; S is an integer from 1 to 3; R and R' are each independently 1,4-dithiene diradical ring systems; X' and Y' are each independently connecting units comprising a single atom, or a group of atoms; and M is an atom or a group of atoms acting as a charge-compensating ionic dopant whose electrical charge is opposite to the charge exhibited by the recurring repeat units of the polymer backbone:

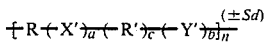

The repeat units form the polyanion or polycation of the electroactive polymer.

The R and R' groups are 1,4- dithiene diradicals selected from those of the following formulae:

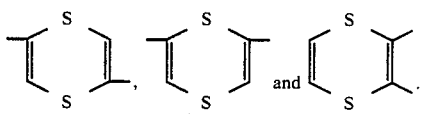

Preferably, R and R' are each diradicals of the formula:

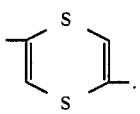

More specifically, R and R' are the dithiene diradicals previously recited or mixtures of the diradicals which are linked to one another either directly or via the connecting units X' and Y' by forming bridges.

The connecting units X' and Y' can be selected from the group comprising:

$$-O-;\ -S-;\ -N-;\ -CH=CH-;\ -C\equiv C-;$$
$$\overset{R_1}{|}$$

$$-CH=CH-CH=CH-;\ -CH=CH-S-CH=CH-;$$

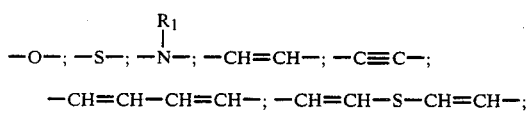

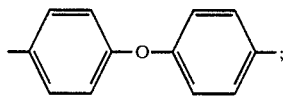

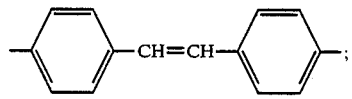

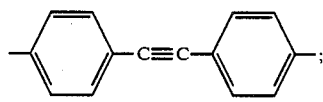

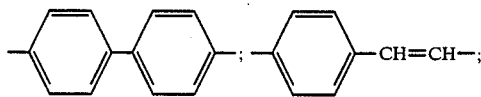

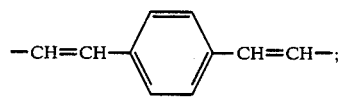

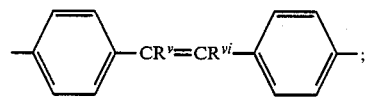

$-CR^{vii}=CR^{vii}-$; and 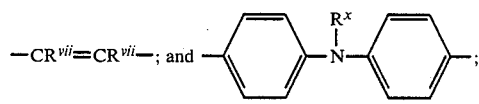

wherein $R_1$ is lower alkyl $C_1$-$C_6$, aryl, cycloalkyl and alkoxy; $R^v$, $R^{vi}$ and $R^{vii}$ are H or methyl, methoxy, halogen and mixtures thereof; and $R^x$ is $C_1$-$C_4$ alkyl. 4,4'-biphenylene, vinylene, 1,4-phenylene, and acetylene connecting groups are preferred connecting units. Especially preferred connecting units are 1,4-phenylene and 4,4'-N-alkylaminodiphenylene.

The molecular weight determines the physical properties of the electroactive polymer. The magnitude of n is a function of the molecular weight. Preferably, n is from 5 to 500. Most preferably, n is from 10 to 300. Molecular weights of the polymer should be between about 250 and about 250,000. A preferred molecular weight is above about 10,000. Tractable films are formed with electroactive polymers wherein n is adjusted so that the molecular weight exceeds 10,000.

The enhancement in conductivity of the electroactive polymer above the conductivity of polymer in the virgin state is determined by d. The value for d is not greater than 2 n. The conductivity is increased and adjusted by increasing d. Conductivities in the semiconductor region can generally be achieved with d values of about 5 percent the n value, e.g., d equals 5 when n equals 100.

Preferred electroactive polymers are doped polymers that have conductivities greater than about $1 \times 10^{-10}$ ohm$^{-1}$ cm$^{-1}$, most preferably greater than $1 \times 10^{-4}$ ohm$^{-1}$ cm$^{-1}$. Greater concentrations of the charge-compensating ionic dopant M increase the conductivity to the metallic conductivity regime. The charge-compensating cationic or anionic dopant M is selected from the previously recited dopants and the like. M remains the same for all the following preferred polymers.

The R and R' groups may be the same or different. When a is 1, b and c are zero, R' and Y' drop out and the polymer has the following formula:

$$-R-X']_n{}^{(\pm Sd)}[M^{\pm S}]_d$$

A preferred polymer of this formula is poly-1,4-phenylene-2,5-(1,4-dithiene) doped with a conductivity modifier. Other preferred polymers include poly-1,4-phenylene-2,5-(3,6-diphenyl-1,4-dithiene) and poly-1,4-phenylene-2,6-(3,5-diphenyl-1,4-dithiene), doped with conductivity modifiers. Copolymers of the above are also contemplated.

When a and c are 1 and b is zero, Y' drops out and the polymer has the formula:

$$-R-X'-R']_n{}^{(\pm Sd)}[M^{\pm S}]_d$$

A preferred polymer of this formula is poly-5,5'-(1,4-phenylene-bis-2,2'-(1,4-dithiene)) doped with a conductivity modifier.

When a is zero and b and c are 1, X' drops out and the polymer has the formula:

$$-R-R'-Y']_n{}^{(\pm Sd)}[M^{\pm S}]_d$$

When a, b, and c are zero, R', X', Y' drop out and the polymer has the formula:

$$-R]_n{}^{(\pm Sd)}[M^{\pm S}]_d$$

A preferred polymer of this formula is poly-2,5-(1,4-dithiene) doped with a conductivity modifier.

Although the polymers of the invention can be made up solely of 1,4-dithienes, the preferred materials are copolymers wherein the dithiene rings are connected through another group, designated a connecting unit. In general, the connecting units should preserve the conjugation of the heterodiazole rings. The connecting units themselves must either be conjugated or maintain pi orbital overlap with the heterocyclic ring systems.

Connecting units may be selected from heteroatoms, such as the Group VB and VIB elements of the Periodic Table, including oxygen, sulfur, selenium, tellurium, monosubstituted nitrogen, phosphorus, arsenic or antimony. Preferably, the connecting units are conjugated carbon systems, such as olefins or aryl ring systems.

Olefinic connecting units are those obtained by removing a hydrogen atom from each end of the olefinic double bond or from each end of a conjugated double bond system. Typical olefinic connecting units include those obtained from ethylene, butadiene, cyclopentadiene, divinylether, and the like.

Aryl ring connecting units are obtained from the corresponding aromatic compounds by removing two hydrogen atoms from carbon atoms in the aromatic ring system. Typical aromatic connecting units include those obtained from benzene, naphthalene, diphenyl, diphenyl ether, diphenyl sulfide, diphenylkylamine, anthracene, and the like. Other aryl connecting units are obtained from alkyl or alkenyl aromatics, by removing two hydrogen atoms, either from the ring, from the alkenyl group, or one hydrogen each from the ring and from the alkenyl group. Typical connecting units of this type include those obtained from styrene, divinylbenzene, stilbene, and the like.

Polymer Fabrication

The starting material for preparing the electroactive polymers of this invention are polymers and copolymers comprising recurring units of a 1,4-dithiene ring system. The 1,4-dithiene polymers are made by the process of J.A.C.S., 59, 262 (1936) as applied to bis compounds. Thus, for example, bis-dibromacetyl aromatic compounds are converted to 1,4-dithiene polymers having aromatic connecting units. Similarly, 1,4-dithiene polymers having an ethylene connecting unit are obtained from the corresponding unsaturated bis-bromacetyl compounds.

In addition, 1,4-dithiene may be converted to a polymer by dichlorinating and then reacting with sodium sulfide. The resulting polymer has sulfur connecting units.

The 1,4-dithiene ring systems may optionally be substituted with one or two substituents, such as phenyl or lower alkyl of one to six carbon atoms.

Tractable Polymer Fabrication

Subsequent to polymerization, articles such as fibers, ribbons, or free-standing films are cast from solution. The solution is formed by dissolving the desired polymer in a solvent which consists of sulfuric acid, formic acid, methane sulfonic or polyphosphoric acid. The solution temperature is generally from about 20° C. to about 100° C. The polymers are coagulated into solid shapes such as fibers, ribbons, or free-standing films in a basic coagulation bath. For free-standing films, the polymers are fabricated from solutions containing about 2 to 25% polymer dissolved in the solvent. At concentrations which exceed 10%, the cast films take on an anisotropic morphology. The anisotropic property enhances the conductivity in the anisotropic direction. An amine, for example triethylamine, dissolved in a protonic solvent such as H$_2$O and preferably ethyl alcohol comprises the coagulation bath. The bath is maintained at a lower temperature than the dissolution temperature of the polymer in the solvent. Usually room temperature is selected as the operating temperature of the coagulation bath. The fabricated articles are dried. Elevated temperatures, usually 60° C., and reduced pressure accelerated the drying process. Drying is continued until no further weight loss is observed.

Alternatively, films are cast into water, comprising the coagulation bath, followed by neutralization in aqueous bicarbonate. Neutralized films are washed in water and dried at elevated temperatures, 60°–100° C., under reduced pressure.

Polymer Conductivity Modification

After fabrication of the desired articles from the heterocyclic polymers by means of the procedure described above, the articles are rendered electroactive by, for example, chemical or electrochemical procedures. The articles can be rendered electroactive in an atmosphere which is inert with respect to the polymer and dopant, by contacting them with suitable conductivity modifiers, i.e. dopants. An inert atmosphere is defined as an atmosphere which does not react with the polymer, the dopant, or the electroactive polymer. For example, the atmosphere can be argon, helium, and nitrogen and the like. The doping can also be carried out in an inert liquid medium such as tetrahydrofuran, acetonitrile and the like. The inert liquid medium should be able to wet and swell the polymer but not react with it. The dopants can be oxidizing or electron accepting molecules, or reducing or electron donating molecules. Both types of dopants may be in the form of gases or vapors, pure liquids or liquid solutions. Preferably, oxygen and water moisture are excluded during and after the doping process because the conductive polymers tend to degrade, i.e. lose conductivity, when exposed thereto.

For example, the polymer can be contacted with conductivity modifiers, such as alkali naphthalides or alkali anthracenides such as sodium naphthalide, potassium naphthalide, or sodium anthracenide in a tetrahydrofuran solution. The conductivity modifier concentration can be from about 0.001 to about 1 molar and preferably from about 0.01 to about 0.5 molar in the THF or other suitable solvent. Alternative doping methods are taught in U.S. Pat. No. 4,204,216 and incorporated herein by reference.

The incorporation of the dopants into the polymer can be observed by a color change in the polymer as well as an enhanced conductivity. For example, a virgin polymer film having a yellow, orange or brown color, changes to a green, blue or black color with a metallic luster upon doping and the measured conductivity increases by many orders of magnitude.

Alternatively, the polymers can be oxidized or reduced to their conductive forms using electrochemical techniques. In this method, herein referred to as electrochemical doping, the polymer is immersed in a suitable electrolyte solution and used as one electrode of an electrochemical cell. Upon passing an electric current through such a cell the polymer becomes reduced (or oxidized, depending upon the direction of current flow) and charge-compensating cations (or anions) from the supporting electrolyte become incorporated into the polymer. This doping also proceeds with the characteristic color change described above. Thus, the polymer can be electrochemically doped with whatever appropriately charged ion is present in the electrolyte solution. Electrolyte solutions are comprised of a salt dissolved in a solvent. Suitable solvents are acetonitrile, tetrahydrofuran, 2-methyl-tetrahydrofuran, propylene carbonate, dimethylformamide, dimethylsulfoxide and the like. Alternative electrolytes are specified in U.S. application Ser. No. 334,509, filed Dec. 28, 1981, entitled "Batteries Fabricated With Electroactive Polymers", and completely incorporated herein by reference. Suitable cations are Li+, Na+, K+, (CH₃)₄N+, (C₂H₅)₄N+ and (C₄H₉)₄N+. Suitable anions are Cl−, Br−, ClO₄−, BF₄−, and PF₆−. The extent of doping can be easily controlled by adjusting the amount of charge electrochemically injected into the polymer, either by controlling the magnitude of the current used (galvanostatic charging) or by controlling the potential of the polymer electrode with respect to a reference electrode (potentiostatic charging).

The above-described electrochemical doping process is completely reversible. The polymer can be "undoped" and returned to its original, neutral, non-conducting state simply by applying a current opposite in sign to that used for the doping process. Upon complete undoping the color of the polymer reverts back to its original color. Thus, for example, a reduced, conducting poly-dithiene polymer can be reoxidized completely to its neutral, non-conducting form, and the charge-compensating cations incorporated during the electrochemical reduction process are expelled from the article during electrochemical re-oxidation.

Having described the methods of fabrication and the basic heterocyclic systems, the following examples are intended to be illustrative of the invention and not meant to limit the scope thereof. Modification which would be obvious to one of ordinary skill in the art are contemplated to be within the scope of the invention.

EXAMPLES

EXAMPLE 1

Poly-1,4-phenylene-2,5-(1,4-dithiene)

Preparation of monomer, 1,4-phenylene-bis(acetyl thiosulfate) disodium salt

A 250 ml Erlenmeyer flask was charged with 9 g of 1,4-bis (bromoacetyl) benzene, 50 ml of water, 50 ml of ethanol, and 17 g of sodium thiosulfate. The mixture was heated with stirring at 60°–70° C. for 1 hour and then allowed to cool. The yellow crystalline bis-Bunté salt was filtered and washed with ethanol to yield 8.8 g of 1,4-phenylene-bis(acetyl thiosulfate) disodium salt.

Preparation of poly-1,4-phenylene-2,5-(1,4-dithiene)

One gram of the bix-Bunté salt prepared above is added to 50 g of polyphosphoric acid and heated at 75°–85° C. with stirring for 16 hours. An aliquot is withdrawn and coated on platinum wires. The remainder is poured into water and the polymer powder filtered off and washed with water, ethanol, and finally, chloroform.

Electrochemical Doping of Polymer on a Wire

The product of the Example is dissolved in concentrated sulfuric acid to give about a 2 weight percent solution. A platinum wire, 0.5 mm in diameter, is dipped into this solution. After removing it from the solution, exces liquid is gently wiped off and then the wire is placed in a water bath for 30 minutes at ambient temperature. Next it is soaked in a 5% sodium bicarbonate solution for 16 hours. At the end of this time the wire is rinsed with water, rinsed with acetone, and then dried under vacuum.

The resulting polymer-coated wire is submitted to a cyclic voltammetric analysis. For this analysis, the electrolyte is an 0.1 molar solution of tetraethylammonium tetrafluoroborate in acetonitrile. Measurements are made with reference to a silver/silver nitrate reference electrode and subsequently converted into voltages with the standard calomel electrode (SCE). A reversible reduction potential is obtained.

EXAMPLE 2

Random Copolymer, Co-poly-1,4-phenylene-[2,5-(3,6-diphenyl-1,4-dithiene)]-[2,6-(3,5-diphenyl-1,4-dithiene)]

1,4-Bis-(phenylglyoxaloyl) benzene, prepared according to Paciorek et al. in U.S. Pat. No. 4,024,067, is dissolved in a solvent such as odichlorobenzene or dimethyl formamide and heated at 100° C. in the presence of dry HCl and hydrogen sulfide to yield the random copolymer of the example.

Using the method of Example 1, a platinum wire is coated with the polymer of the Example. The resulting polymer-coated wire is submitted to a cyclic volammetric analysis and a reversible reduction potential is obtained.

What is claimed is:

1. A tractable electroactive polymer which comprises a charged polymer backbone of recurring units of a 1,4-dithiene diradical selected from the group consisting of:

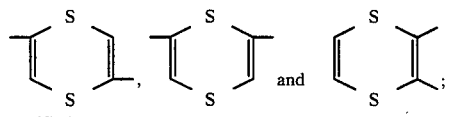

and a sufficient concentration of a charge-compensating ionic dopant associated therewith, wherein the polymer backbone is capable of undergoing reversible oxidation or reversible reduction or both to form the charged polymer backbone.

2. The electroactive polymer according to claim 1, wherein the recurring units are interspersed with connecting units selected from the group consisting of:

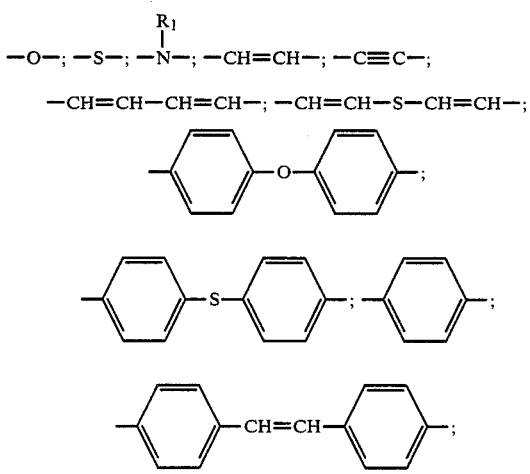

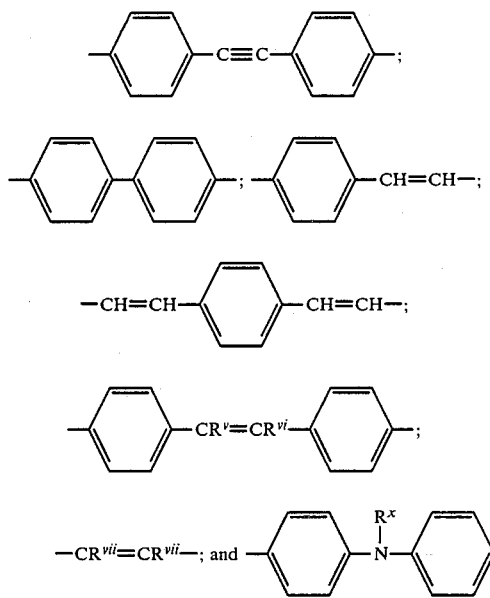

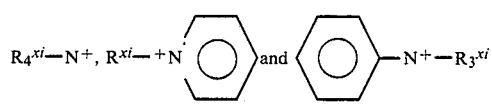

wherein $R_1$ is lower alkyl $C_1$–$C_6$, aryl, cycloalkyl, and alkoxy; $R^v$, $R^{vi}$ and $R^{vii}$ are H, methyl, methoxy, halogen, and mixtures thereof; and $R^x$ is $C_1$–$C_4$ alkyl.

3. The electroactive polymer according to claim 2, wherein the connecting units are selected from the group consisting of 1,4-phenylene, 4,4'-biphenylene, vinylene and ethynylene.

4. The electroactive polymer according to claim 3, wherein the connecting unit is 1,4-phenylene.

5. The electroactive polymer according to claim 2, wherein the connecting unit is 4,4'-N-alkylaminodiphenylene.

6. The electroactive polymer according to claim 1, wherein the charge-compensating ionic dopant is a cation selected from the group consisting of the alkali metal ions, alkali earth metal ions, Group III metal ions,

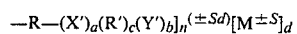

wherein $R^{xi}$ is a straight- or branched-chain alkyl group of $C_1$–$C_6$, or mixtures of said cations.

7. The electroactive polymer according to claim 1, wherein the polymer backbone has a molecular weight of from about 250 to about 250,000.

8. The electroactive polymer according to claim 7, wherein the polymer backbone has a molecular weight above about 10,000.

9. A tractable electroactive polymer which comprises a charged polymer backbone and charge-compensating ionic dopants associated therewith of the formula:

$$-R-(X')_a(R')_c(Y')_b]_n^{(\pm Sd)}[M^{\pm S}]_d$$

wherein a is 0 or 1; b is 0 or 1; c is 0 or 1; n is an integer from 2 to 1,000; d is an integer from 1 to 2,000; S is an integer from 1 to 3; R and R' are each independently 1,4-dithiene diradicals selected from the group consisting of:

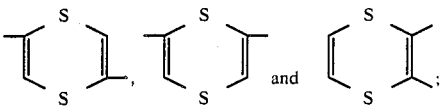

X' and Y' are each independently connecting units selected from the group consisting of:

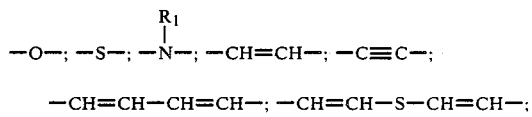

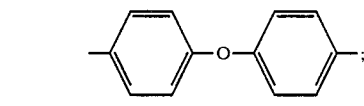

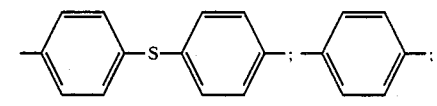

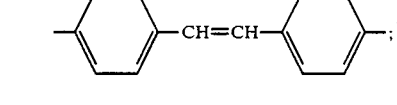

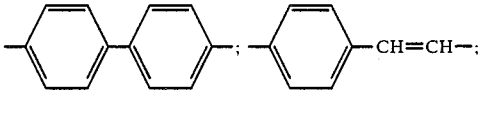

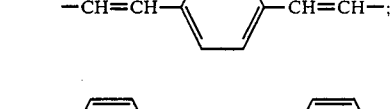

wherein $R_1$ is lower alkyl $C_1$–$C_6$, aryl, cycloalkyl, and alkoxy; $R^v$, $R^{vi}$ and $R^{vii}$ are H, methyl, methoxy, halogen, and mixtures thereof; and $R^x$ is $C_1$–$C_4$ alkyl; and M is a charge-compensating ionic dopant of opposite electrical charge to the charge of the polymer backbone; wherein the polymer backbone is capable of undergoing reversible oxidation or reversible reduction or both to form the charged polymer backbone.

10. The electroactive polymer according to claim 9, wherein R and R' are each diradicals of the formula:

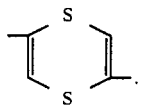

11. The electroactive polymer according to claim 9, wherein X' and Y' are independently selected from the group consisting of 1,4-phenylene, 4,4'-biphenylene, vinylene and ethynylene.

12. The electroactive polymer according to claim 11, wherein X' and Y' are 1,4-phenylene.

13. The electroactive polymers according to claim 9, wherein X' and Y' are 4,4'-N-Alkylaminodiphenylene.

14. The electroactive polymer according to claim 9, wherein n is from about 5 to about 500.

15. The electroactive polymer according to claim 9, wherein a is 1, b and c are zero, and the polymer has the formula:

$$-R-X']_n{}^{(\pm Sd)}[M^{\pm S}]_d.$$

16. The electroactive polymer according to claim 9, wherein a, b and c are zero, and the polymer has the formula:

$$-R]_n{}^{(\pm Sd)}[M^{\pm S}]_d.$$

17. The electroactive polymer according to claim 9, wherein the charge-compensating ionic dopant M is a cation selected from the group consisting of the alkali metal ions, alkali earth metal ions, Group III metal ions, and

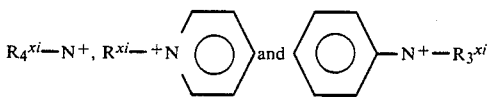

wherein $R^{xi}$ is a straight- or branched-chain alkyl of $C_1$–$C_6$, or mixtures of said cations.

* * * * *

UNITED STATES PATENT AND TRADEMARK OFFICE
CERTIFICATE OF CORRECTION

PATENT NO. : 4,502,980

DATED : March 5, 1985

INVENTOR(S) : Peter Denisevich, Jr. et al

Page 1 of 2

It is certified that error appears in the above-identified patent and that said Letters Patent are hereby corrected as shown below:

Column 6, Line 35, and Claim 15, Column 14, Line 1, the formula "$-R-X']_n(\pm Sd)[M^{\pm}S]_d$", should read -- $\{R-X']_n(\pm Sd)[M^{\pm}S]_d$ --.

Column 6, Line 47, the formula "$-R-X'-R']_n(\pm Sd)[M^{\pm}S]_d$", should read -- $\{R-X'-R'\}_n(\pm Sd)[M^{\pm}S]_d$ --.

Column 6, Line 55, the formula "$-R-R'-Y']_n(\pm Sd)[M^{\pm}S]_d$", should read -- $\{R-R'-Y'\}_n(\pm Sd)[M^{\pm}S]_d$ --.

Column 6, Line 60, and Claim 16, Column 14, Line 7, the formula "$-R]_n \pm Sd)[M^{\pm}S]_d$", should read -- $\{R\}_n(\pm Sd)[M^{\pm}S]_d$ --.

UNITED STATES PATENT AND TRADEMARK OFFICE
CERTIFICATE OF CORRECTION

PATENT NO. : 4,502,980
DATED : March 5, 1985
INVENTOR(S) : Peter Denisevich, Jr. et al It is certified that error appears in the above-identified patent and that said Letters Patent are hereby corrected as shown below:

Column 11, Line 62, the formula " $-R-(X')_a(R')_c(Y')_b]_n^{(\pm Sd)}[M^{\pm S}]_d$," should read -- $[R\{X'\}_a\ \ (R')\ \ (Y')_b\ ]_n^{(\pm Sd)}[M^{\pm S}]_d$ --.

Signed and Sealed this

Twenty-fourth Day of December 1985

[SEAL]

Attest:

DONALD J. QUIGG

Attesting Officer

Commissioner of Patents and Trademarks